(12) United States Patent
Shibata et al.

(10) Patent No.: US 8,143,557 B2
(45) Date of Patent: Mar. 27, 2012

(54) PLANE HEATER

(75) Inventors: Kazuo Shibata, Tokyo (JP); Hiroo Kawasaki, Nirasaki (JP); Teruo Iwata, Nirasaki (JP); Manabu Amikura, Nirasaki (JP)

(73) Assignees: Covalent Materials Corporation, Tokyo (JP); Tokyo Electron Limited, Tokyo (JP)

( * ) Notice: Subject to any disclaimer, the term of this patent is extended or adjusted under 35 U.S.C. 154(b) by 880 days.

(21) Appl. No.: 12/279,953

(22) PCT Filed: Feb. 7, 2007

(86) PCT No.: PCT/JP2007/052081
§ 371 (c)(1),
(2), (4) Date: Aug. 19, 2008

(87) PCT Pub. No.: WO2007/097193
PCT Pub. Date: Aug. 30, 2007

(65) Prior Publication Data
US 2010/0224620 A1  Sep. 9, 2010

(30) Foreign Application Priority Data
Feb. 20, 2006  (JP) ................................ 2006-042294

(51) Int. Cl.
*H05B 3/68* (2006.01)
(52) U.S. Cl. .................................. 219/460.1; 219/444.1
(58) Field of Classification Search .... 219/443.1–468.2, 219/543–548; 118/724, 725
See application file for complete search history.

(56) References Cited

U.S. PATENT DOCUMENTS

| | | | | |
|---|---|---|---|---|
| 6,043,468 A | * | 3/2000 | Toya et al. | 219/544 |
| 6,538,872 B1 | * | 3/2003 | Wang et al. | 361/234 |
| 6,584,279 B2 | | 6/2003 | Seko et al. | |
| 7,189,946 B2 | * | 3/2007 | Goto et al. | 219/444.1 |
| 7,279,661 B2 | * | 10/2007 | Okajima et al. | 219/444.1 |
| 7,417,206 B2 | * | 8/2008 | Nakamura | 219/444.1 |
| 2003/0000937 A1 | | 1/2003 | Ito | |
| 2005/0173413 A1 | | 8/2005 | Goto | |
| 2005/0252903 A1 | | 11/2005 | Maki et al. | |

FOREIGN PATENT DOCUMENTS

| | | |
|---|---|---|
| EP | 1 363 316 A2 | 11/2003 |
| JP | 2000-173750 A | 6/2000 |
| JP | 2001-332373 A | 11/2001 |
| JP | 2004-247210 A | 9/2004 |
| JP | 2005-197161 A | 7/2005 |
| JP | 2005-339898 A | 12/2005 |
| JP | 2006-049270 A | 2/2006 |

* cited by examiner

*Primary Examiner* — Sang Paik
(74) *Attorney, Agent, or Firm* — Foley & Lardner LLP

(57) ABSTRACT

To provide a plane heater, including a carbon wire heating element CW, in which surface arrangement density of the heating element CW in an outer area is denser than that in an inner area. A power supply terminal unit having connection wires for supplying electricity to the heating element CW is arranged in the center on the back side of a silica glass plate-like member 2. Connection wires 4a and 4b connected with the heating element CW in the inner area are connected with the heating element in the inner area in the center of the silica glass plate-like member. Connection wires 3a and 3b connected with the heating element in the outer area are extended from the center of the silica glass plate-like member toward the outer area and connected with the heating element CW in the outer area, without intersecting the heating element CW in the inner area.

6 Claims, 8 Drawing Sheets

PLANE HEATER

TECHNICAL FIELD

The present invention relates to a plane heater, more particularly relates to a plane heater in which a carbon wire heating element is sealed in a silica glass plate-like member, and is suitably used for heat treatment of a wafer etc. in a semiconductor fabrication process.

BACKGROUND ART

In a semiconductor fabrication process, a silicon wafer or the like is subjected to various heat treatments in the process. These heat treatments require strict temperature control and a heat treatment atmosphere is required to be a clean atmosphere which is free from particles, such as fine dusts.

For this purpose, a heater used for the heat treatments is required to provide uniform heating performance and superior temperature rising and decreasing control capabilities and to satisfy the conditions, for example, non-emission of polluting matters such as particles.

As an example of the heater for manufacturing semiconductors, there is a heater in which a heating element is sealed in a support member, such as a quartz glass member or the like, together with a non-oxidizing atmosphere gas.

As a heater which is considerably suitable for the manufacture of semiconductors, the present inventors once developed a heater for a semiconductor heat treatment apparatus, wherein fine carbon single fibers are bound into a plurality of carbon fiber bundles, which are woven into a carbon wire heating element sealed in the support member, such as the quartz glass member or the like, together with the non-oxidizing atmosphere gas. The heater is already proposed in Japanese Patent Application Publication (KOKAI) No. 2000-173750 (Patent Document 1) and Japanese Patent Application Publication (KOKAI) No. 2001-332373 (Patent Document 2).

Now, referring to FIGS. 11 and 12, the heater as shown in Patent Document 1 will be described. This heater 50 is arranged such that a heating surface 50a is formed in the shape of a rectangle plate and a carbon wire heating element CW is enclosed in a quartz glass support member 51. A substantially hollow space portion is formed around the periphery of the above-mentioned carbon wire heating element CW, and the above-mentioned quartz glass support member 51 has a unified structure except for this space portion.

As the above-mentioned carbon wire heating element CW, one that is knitted in the shape of a wire using a plurality of bundles of fiber bundles in which a plurality of carbon fibers are bundled is used, for example. Further, as shown in FIG. 11, the above-mentioned carbon wire heating element CW is arranged at a surface of the quartz glass support member 51 in a so-called zigzag form.

Further, a tip of the carbon wire heating element CW is pulled out almost perpendicularly to a heating surface 50a, and is connected to a Mo terminal wire 53 through a carbon terminal 52. These are arranged in a quartz glass pipe 54. The Mo terminal wire 53 is connected to two Mo external connection wires 56 through a Mo foil 55. In addition, the Mo foil 55 is pinch sealed.

Further, the heater as shown in Patent Document 2 will be described with reference to FIGS. 13 and 14. In a quartz glass support member 61 of a plate-like heater 60, a heating surface is circular and plate-like, and the carbon wire heating elements CW are wired at a space portion 61a inside the support member 61 in a so-called zigzag pattern form. Further, it is arranged to be fused to and integral with this quartz glass support member 61 except for this space portion 61a. Further, sealing terminals 62 are connected to both ends of the carbon wire heating element CW, respectively, and an inert gas is introduced and sealed in the above-mentioned space portion 61a.

Thus, the above-mentioned carbon wire heating elements as shown in Patent Documents 1 and 2 have small thermal capacity and are excellent in rise and fall temperature characteristics compared with a metal heating element etc., and are excellent also in high temperature durability in a non-oxidizing atmosphere. Since it is made by knitting a plurality of fiber bundles of thin carbon single fibers, it is sufficiently flexible in shape, and has an advantage that it can easily be made into various structures and shapes compared with a heating element constituted only by carbon materials.

Therefore, the heater in which this heating element is sealed together with the non-oxidizing gas in the clean heat-resistant support member with a high purity quartz glass member etc. does not generate particle etc., and it is very suitable as the heater for the manufacture of semiconductors, as described above.

[Patent Document 1] Japanese Patent Application Publication No. 2000-173750

[Patent Document 2] Japanese Patent Application Publication No. 2001-332373

DISCLOSURE OF THE INVENTION

Problems to be Solved by the Invention

Incidentally, in the plane heater as shown in the above-mentioned Patent Document 1, one carbon wire heating element is wired in the so-called zigzag pattern form. Further, in the plane heater as shown in the above-mentioned Patent Document 2, the carbon wire heating elements passing from a periphery portion toward a center and from the center to the periphery portion are arranged symmetrically from left side to right side.

In the case of such an arrangement pattern of the conventional carbon wire heating element, there is a technical problem that unevenness arises in temperature distribution on the heating surface, and the inside of a plane of a heated material can not be heated uniformly. Furthermore, there is another technical problem that when the carbon wire heating element is formed and arranged in the zigzag pattern form or a spiral shape pattern at regular intervals, the center of the heating surface of the heater is heated to a high temperature, and the temperature of the periphery side portion becomes low. As a result, in the case where an in-plane temperature of the heated material, such as a wafer, is heat-treated uniformly, it is not possible to place it directly on the heating surface, but it is necessary to position a heat equalizing plate on the heating surface, and place the heated material on the heat equalizing plate.

Under such a condition, it is desired that uneven heating temperature distribution of the heating surface may be corrected and that the plane heater may appear in which the heated material can be placed on the heating surface not via the heat equalizing plate.

The present inventors have diligently performed research and development paying attention to the arrangement pattern of the carbon wire heating element as one method of correcting uneven heating temperature distribution of the heating surface. As a result, the inventors have come to find an arrangement pattern which allows the heating surface to be a substantially uniform heating temperature plane, and have completed a plane heater in accordance with the present invention.

The present invention is made in order to solve the above-mentioned technical problem and aims at providing a plane heater including a carbon wire heating element having an arrangement pattern which allows the heating surface to be a substantially uniform heating temperature plane.

Means to Solve the Problem

The plane heater in accordance with the present invention made in order to attain the above-mentioned object is a plane heater characterized in that a carbon wire heating element is arranged and sealed two-dimensionally inside a silica glass plate-like member, surface arrangement densities of the above-mentioned carbon wire heating element are different in an inner area and an outer area located in the periphery, the surface arrangement density in the above-mentioned outer area is denser than the surface arrangement density in the inner area, a power supply terminal unit having connection wires for supplying electricity to the above-mentioned carbon wire heating element is arranged in the center on the back side of the above-mentioned silica glass plate-like member, the connection wire connected with the carbon wire heating element in the above-mentioned inner area is connected with the carbon wire heating element in the inner area in the center of the above-mentioned silica glass plate-like member, and the connection wire connected with the carbon wire heating element in the above-mentioned outer area is extended from the center of the above-mentioned silica glass plate-like member toward the outer area, and is connected with the carbon wire heating element in the outer area, without intersecting the carbon wire heating element in the above-mentioned inner area.

Thus, in the plane heater in accordance with the present invention, the surface arrangement densities of the carbon wire heating element differ in the inner area and the outer area located in the periphery. Since the surface arrangement density in the above-mentioned outer area is denser than the surface arrangement density in the inner area, the temperature distribution of the heating surface can be made uniform and the in-plane temperature of the heated material can be made uniform. Further, in the plane heater in accordance with the present invention, the power supply terminal unit having the connection wire for supplying electricity to the above-mentioned carbon wire heating element is arranged in the center on the back side of the silica glass plate-like member, attaining miniaturization compared with the heater which has two terminal units as shown in FIG. 14. Furthermore, without intersecting the carbon wire heating element in the inner area, the connection wire connected with the carbon wire heating element in the above-mentioned outer area is extended from the center toward the outer area, and is connected with the carbon wire heating element in the outer area, whereby heat accumulation can be controlled, early degradation by devitrification of the silica glass plate-like member can be prevented, and the temperature of the heating surface can be made more uniform.

Now, it is desirable that the above-mentioned carbon wire heating element and the above-mentioned connection wire are the carbon wires made by knitting a plurality of fiber bundles (which are made by bundling the carbon fibers) to be in the shape of a braid or in the shape of an interlace. In the case where the connection wire is constituted by ones that are obtained by binding a large number of carbon wires of the same structure as the above-mentioned carbon wire heating element, a low resistance area can be formed more simply, while maintaining good electric connection.

Further, it is desirable that the above-mentioned silica glass plate-like member is disc-shaped, and a boundary between the above-mentioned inner area and the outer area exists at a distance of between 79% and 86% of a radius from the circle center in the plane. In the case where the boundary between the inner area and the outer area on the surface of the above-mentioned silica glass plate-like member is at a distance less than 79% of the radius from the circle center in the plane, the outer area is large and the high temperature occurring in the center as in the conventional technology cannot be avoided. As a result, surface uniformity of the heating surface is inhibited. On the other hand, in the case where the boundary between the inner area and the outer area of the arrangement pattern is at a distance greater than 86% of the radius from the circle center in the plane, the outer area is small, a heat generation rate in the outer area is insufficient, and the surface uniformity of the heating surface is inhibited.

Further, it is desirable that the above-mentioned silica glass plate-like member is rectangular, and the boundary between the above-mentioned inner area and the outer area exists at a distance of between 79%-86% of ½ length of one side from a rectangle center in the plane. As described above, in the case where the boundary between the inner area and the outer area on the surface of the above-mentioned silica glass plate-like member is at a distance less than 79% of the radius from the rectangle center in the plane, the outer area is large and the high temperature occurring in the center as in the conventional technology cannot be avoided. As a result, the surface uniformity of the heating surface is inhibited. On the other hand, in the case where the boundary between the inner area and the outer area of the arrangement pattern is at a distance greater than 86% of the radius from the rectangle center in the plane, the outer area is small, the heat generation rate in the outer area is insufficient, and the surface uniformity of the heating surface is inhibited.

Furthermore, it is desirable that the above-mentioned silica glass plate-like member is disc-shaped and the connection wire which is extended from the above-mentioned center toward the outer area and connected with the carbon wire heating element in the outer area exists in a diameter position of the disc-shaped silica glass plate-like member, and that bordering the above-mentioned connection wire, the above-mentioned carbon wire heating elements are connected together electrically in parallel on both the inner area side and the outer area.

By arranging the connection wires in this way, the inner area can be formed into two areas, and the outer area can be formed into two areas, and electricity can be equally supplied to each area.

Further, it is desirable that the above-mentioned silica glass plate-like member is rectangular, and the connection wire which is extended from the center toward the outer area and connected with the carbon wire heating element in the outer area exists on a line linking respective central points of two opposing sides, and that bordering the above-mentioned connection wire, the above-mentioned carbon wire heating elements are connected together electrically in parallel on both the inner area side and the outer area.

By arranging the connection wires in this way, the inner area can be formed into two areas, and the outer area can be formed into two areas, and electricity can be equally supplied to each area.

Further, it is desirable that the area where the connection wire connected with the carbon wire heating element in the outer area is arranged is a linear, continuous, and absent area where the carbon wire heating element passing from the center toward the periphery side does not exist, and that in the arrangement pattern of the above-mentioned carbon wire heating element, the linear, continuous, and absent area of the carbon wire heating element passing from the center toward the periphery side does not exist except for the area where the connection wire connected with the carbon wire heating element in the outer area is arranged.

Thus, in the above-mentioned arrangement pattern, the linear, continuous, and absent area of the carbon wire heating element does not exist from the center toward the periphery side, whereby the in-plane temperature of the heating surface can be made uniform, and the inside of the plane of the heated material can be heated uniformly.

In addition, in the plane heater in accordance with the present invention, the in-plane temperature of the heating surface can be made uniform, so that the heat equalizing plate may be omitted. However, in the case where the heat equalizing plate is arranged at a top of the silica glass plate-like member, the inside of the plane of the heated material can be heated more uniformly.

According to the present invention, it is possible to obtain the plane heater provided with the carbon wire heating element having the arrangement pattern which allows the heating surface to be of the substantially uniform heating temperature plane.

DESCRIPTION OF REFERENCE SIGNS

Figure 1:
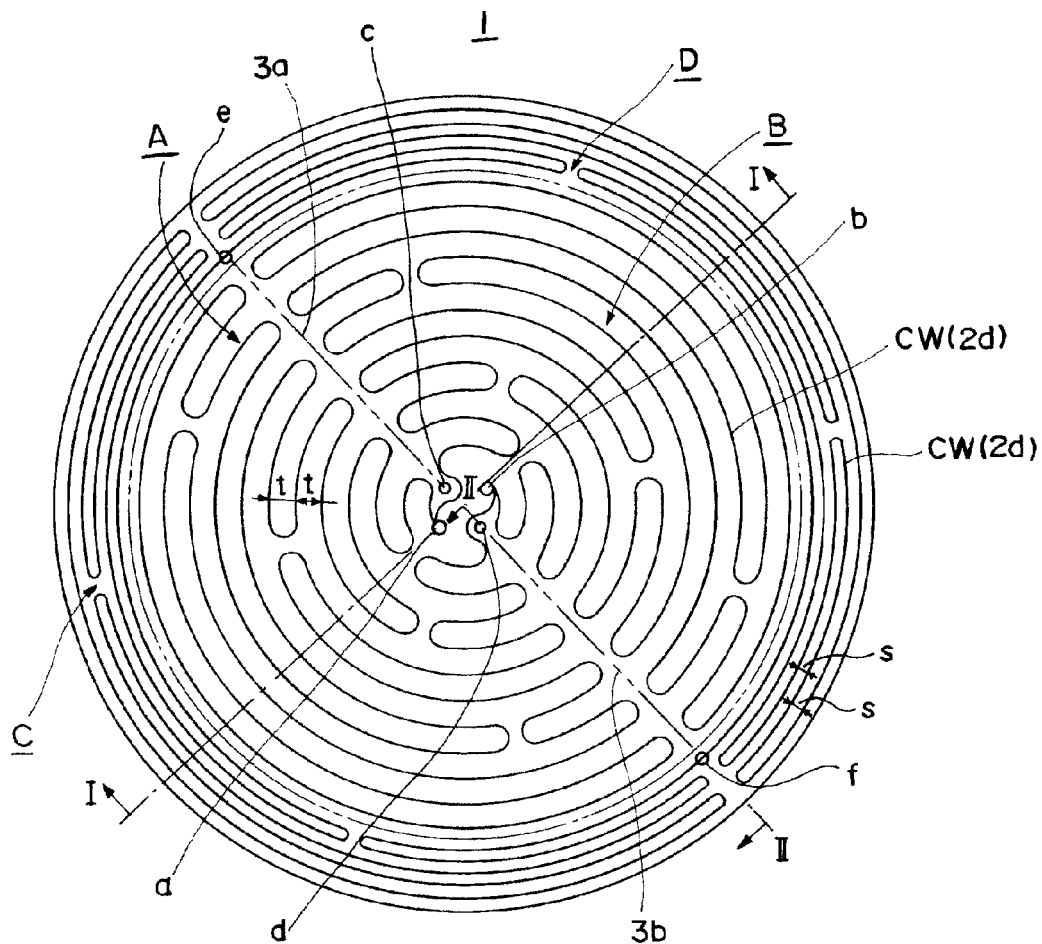
FIG. 1 is a plan view showing a plane heater in accordance with a preferred embodiment of the present invention.

1: plane heater
1a: heating surface
2: silica glass plate-like member
2a: first silica glass member
2b: second silica glass member
2c: third silica glass member
2d: groove
2e1: groove
2e2: groove
3a: connection wire
3b: connection wire
4a: connection wire
4b: connection wire
5a: silica glass pipe
5b: silica glass pipe
6a: silica glass pipe
6b: silica glass pipe
7: silica glass pipe of large diameter
8: power supply terminal portion
CW: carbon wire heating element
CWA: carbon wire heating element in area A
CWB: carbon wire heating element in area B
CWC: carbon wire heating element in area C
CWD: carbon wire heating element in area D
L: boundary

BEST MODE FOR IMPLEMENTING OUT THE INVENTION

Figure 3:
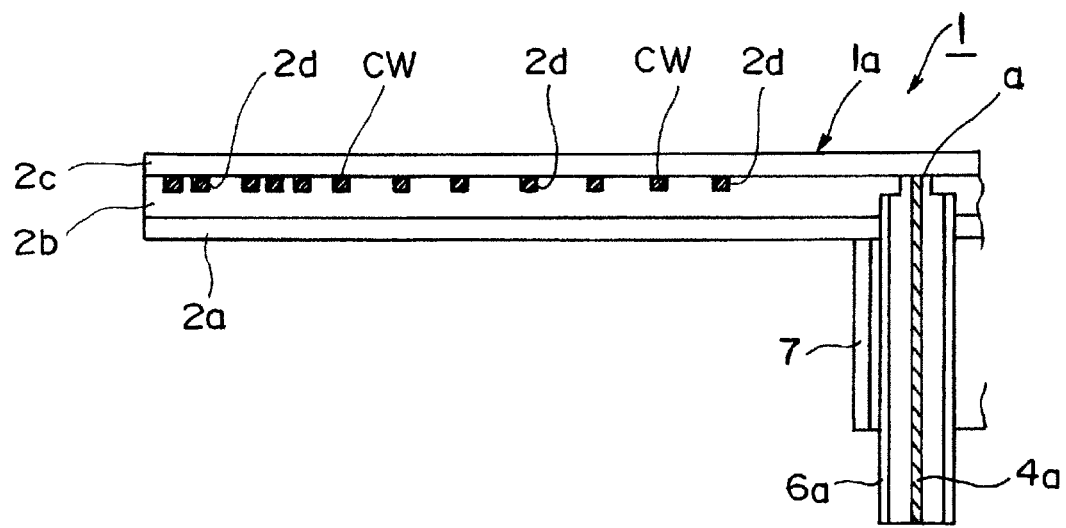
FIG. 3 is a sectional view showing a left-hand side portion taken along a line I-I in FIG. 1.
Figure 4:
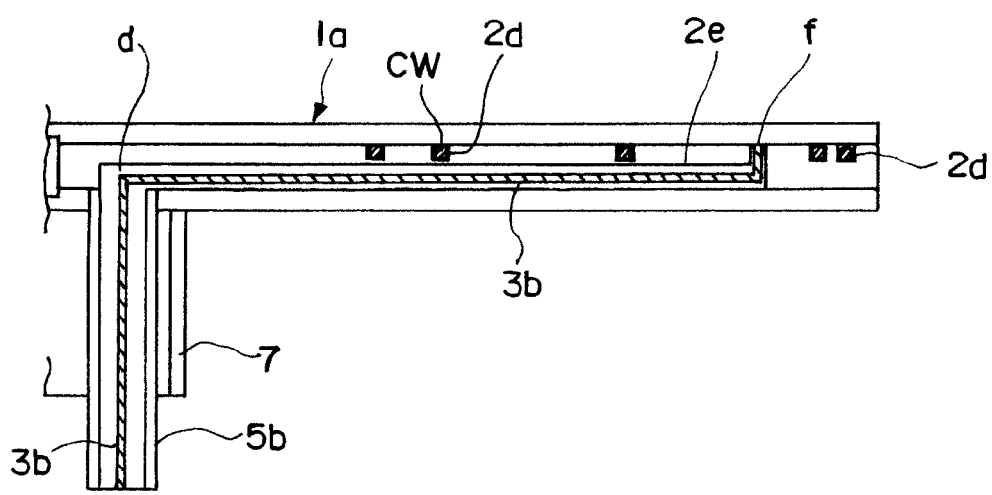
FIG. 4 is a sectional view taken along a line II-II in FIG. 1.
Figure 5:
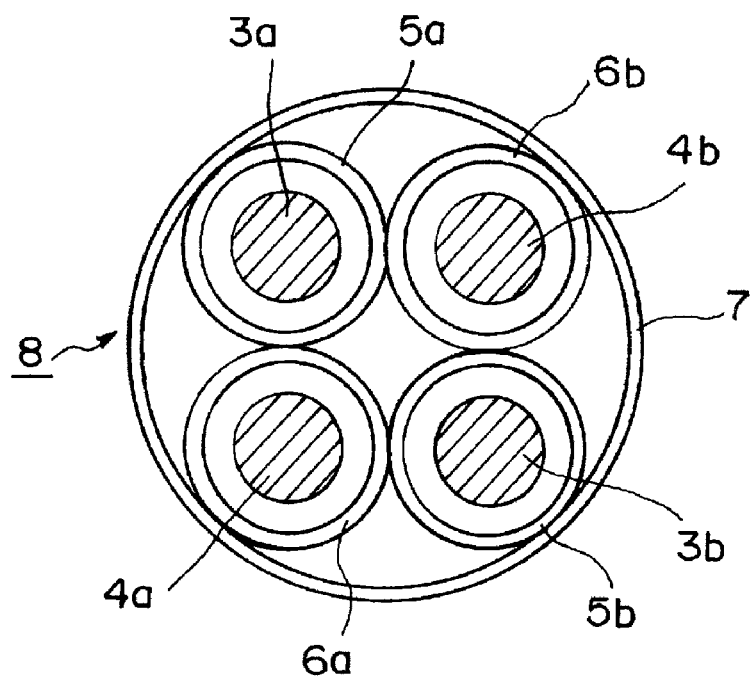
FIG. 5 is a sectional view taken along a line in FIG. 2.
Figure 6:
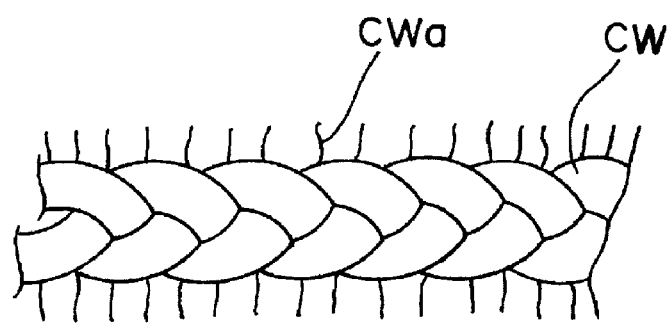
FIG. 6 is a view showing a carbon wire heating element.
Figure 7:
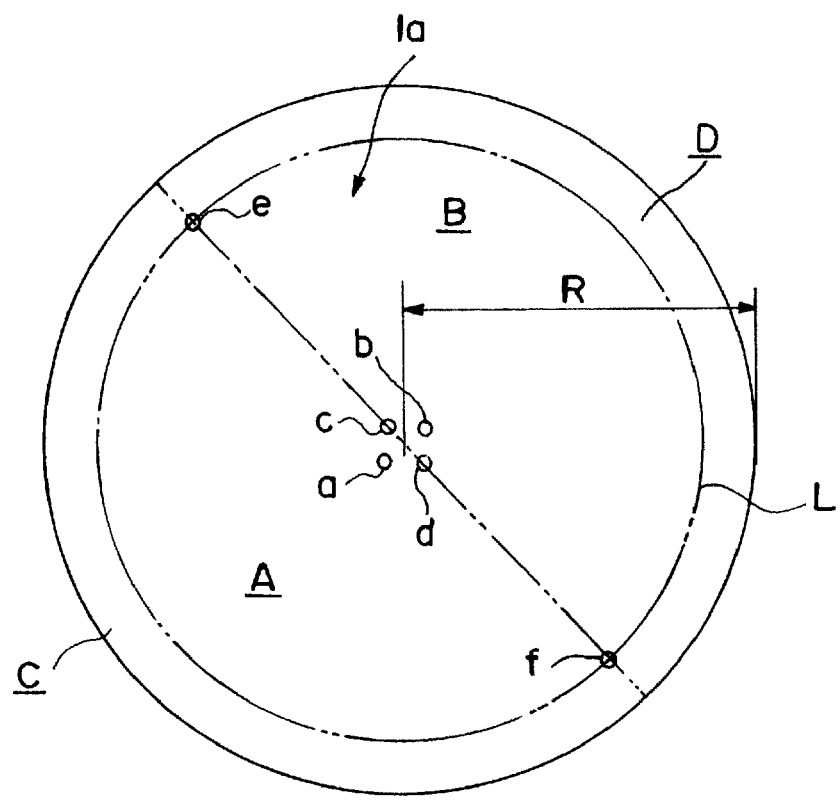
FIG. 7 is a view showing areas where the plane heater as shown in FIG. 1 is divided.
Figure 8A:
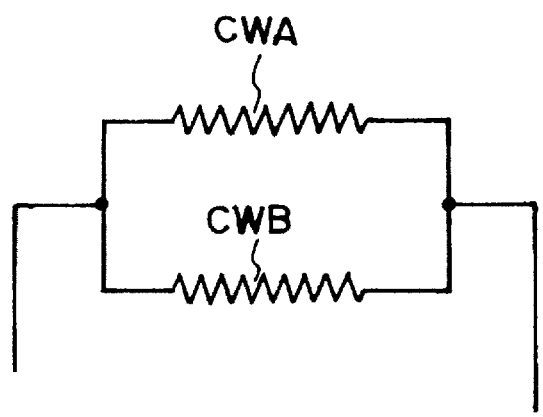
FIGS. 8A and 8b are equivalent circuit diagrams of the plane heater in accordance with a preferred embodiment of the present invention.
Figure 8B:
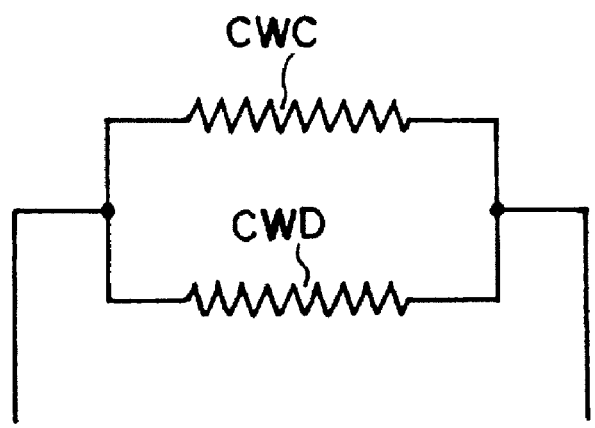

Hereafter, a preferred embodiment in accordance with the present invention will be described with reference to FIGS. 1 through 8. It should be noted that FIG. 1 is a plan view showing a plane heater in accordance with a preferred embodiment of the present invention, FIG. 2 is a side view of the plane heater as shown in FIG. 1, FIG. 3 is a sectional view taken along a line I-I in FIG. 1, FIG. 4 is a sectional view taken along a line II-II in FIG. 1, FIG. 5 is a sectional view taken along a line in FIG. 2, FIG. 6 is a view showing a carbon wire heating element, FIG. 7 is a view showing four areas where the plane heater as shown in FIG. 1 is divided, and FIG. 8 are equivalent circuit diagrams of the plane heater in accordance with a preferred embodiment of the present invention.

Figure 2:
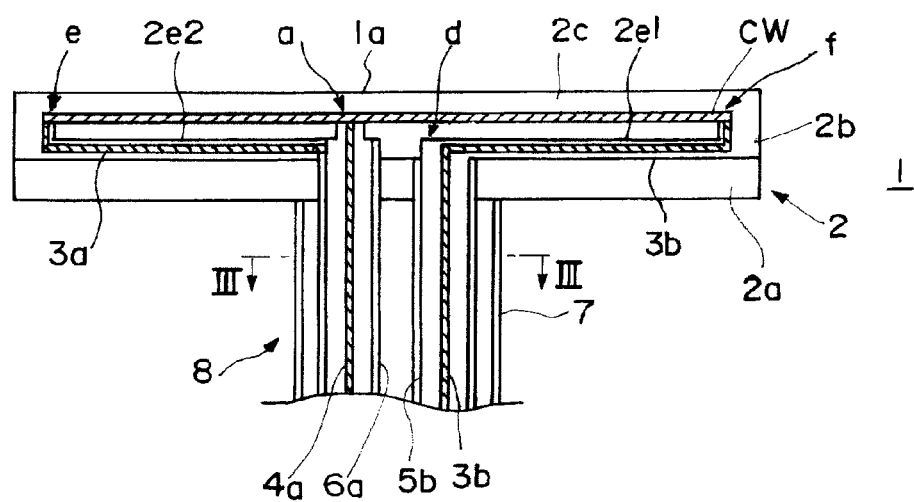
FIG. 2 is a side view of the plane heater as shown in FIG. 1.

As shown in FIGS. 1 and 2, as for this plane heater 1, a heating surface 1a is formed in the shape of a circular plate, and a carbon wire heating element CW is sealed in a silica glass plate-like member 2. The above-mentioned silica glass plate-like member 2 is constituted by a first silica glass member 2a, a second silica glass member 2b, and a third silica glass member 2c.

It should be noted that by "carbon wire heating element is sealed" in the present invention is meant that the carbon wire heating element is hermetically sealed so as not to be exposed to open air.

Tops and bottoms of the first silica glass member 2a and the third silica glass member 2c are formed in the shape of a plate. On the other hand, as shown in FIGS. 3 and 4, grooves 2d with the same shape as the arrangement pattern shown in FIG. 1 are formed at a top of the second silica glass member 2b. Further, grooves 2e1 and 2e2 extending from the center in the diameter direction are provided at the bottom of this the second silica glass member 2b.

In this plane heater, the heating surface 1a is divided into four areas A, B, C, and D as shown in FIGS. 1 and 7. In other words, the carbon wire heating element CW is arranged at each of the areas A and B obtained by halving the inner area of the heating surface 1a, and the areas C and D obtained by halving the outer area located in the periphery of the inner area of the above-mentioned heating surface 1a. It should be noted that the carbon wire heating element CW arranged in the area A is referred to as a carbon wire heating element CWA, the carbon wire heating element CW arranged in the area B is referred to as a carbon wire heating element CWB, the carbon wire heating element CW in the area C is referred to as a carbon wire heating element CWC, and the carbon wire heating element CW in the area D is referred to as a carbon wire heating element CWD.

Further, the grooves 2*d* in the inner area (area A, area B) of the above-mentioned heating surface 1*a* is communicated with through holes formed in a position a and a position b in the center of the heating surface 1*a*. On the other hand, the grooves 2*d* in the outer area (area C, area D) of the heating surface 1*a* are communicated with through holes formed in a periphery side position e and a position f of the heating surface 1*a*.

Further, one end of the above-mentioned groove 2*e*1 is communicated with the through hole formed in a position d in the center of the heating surface 1*a*, and the other end is communicated with the through hole formed in the position f of the periphery portion of the heating surface 1*a*. Similarly, one end of this groove 2*e*2 is communicated with the through hole formed in the position c in the center of the heating surface 1*a*, and the other end is communicated with the through hole formed in the position e of the periphery portion of heating surface 1*a*.

Then, the carbon wire heating elements CW are accommodated in the grooves 2*d* in the inner area (area A, area B) and the outer area (area C, area D), a connection wire 3*b* is accommodated in the groove 2*e*1, and a connection wire 3*a* is accommodated in the groove 2*e*2.

Further, as shown in FIGS. 2 and 5, a power supply terminal unit 8 having connection wires 3*a*, 3*b*, 4*a*, and 4*b* for supplying electricity to the above-mentioned carbon wire heating element CW is provided for a bottom center of the first silica glass member 2*a*. The above-mentioned connection wires 3*a* and 3*b* are connection wires for supplying electricity to the areas C and D in the outer area, and the above-mentioned connection wires 4*a* and 4*b* are connection wires for supplying electricity to the areas A and B on the center side.

As shown in FIGS. 2, 4, and 5, the above-mentioned connection wire 3*a* is accommodated in a silica glass pipe 5*a*, and the connection wire 3*b* is accommodated in a silica glass pipe 5*b*. The silica glass pipes 5*a* and 5*b* which accommodate these connection wires 3*a* and 3*b* pass through the first silica glass member 2*a* and are in contact with the bottom of the second silica glass member 2*b*.

Therefore, the connection wire 3*a* enters the groove 2*e*2 from the silica glass pipe 5*a* in the position c, passes via the through hole of the position e, and is connected with the carbon wire heating elements CWC and CWD in the areas C and D in the outer area. Similarly, the connection wire 3*b* enters the groove 2*e*1 from the silica glass pipe 5*b* in the position d, passes via the through hole of the position f, and is connected with the carbon wire heating elements CWC and CWD in the areas C and D in the outer area.

Further, the above-mentioned connection wire 4*a* is accommodated in the silica glass pipe 6*a*, and the connection wire 4*b* is accommodated in the silica glass pipe 6*b*. These silica glass pipes 6*a* and 6*b* pass through the first silica glass member 2*a* and are in contact with the internal bottom at which the through hole formed in the second silica glass member 2*b* opens. Therefore, the connection wire 4*a* passes via the through hole from the silica glass pipe 6*a* in the position a, and is connected with the carbon wire heating elements CWA and CWB in the areas A and B on the center side. Further, the connection wire 4*b* passes via the through hole from the silica glass pipe 6*b* in the position b, and is connected with the carbon wire heating elements CWA and CWB in the areas A and B on the center side.

Further, the ends of all the silica glass pipes 5*a*, 5*b*, 6*a*, and 6*b* having accommodated therein the above-mentioned connection wires 3*a*, 3*b*, 4*a*, and 4*b* are sealed, and the pipes are accommodated in the silica glass pipe 7 having a large diameter. The silica glass pipe 7 with the large diameter is used as a flange or a shaft for fixing the heater.

Since the connection wires 3*a*, 3*b*, 4*a*, and 4*b* are thus collected in the center of the back side of the heating surface 1*a*, and arranged as the power supply terminal unit 8, it can be reduced in size compared with the conventional heater which has two terminal units in the periphery portion of the heating surface 1*a*.

In order to manufacture the plane heater having such a structure, in a situation where the carbon wire heating element CW is accommodated in the groove 2*d* of the above-mentioned second silica glass member 2, and connected with each of the connection wires 3*a*, 3*b*, 4*a*, and 4*b*, the third silica glass member 2*c* and the second silica glass member 2*b* are fused together to seal the above-mentioned grooves 2*d*, and the first silica glass member 2*a* and the second silica glass member 2*b* are fused together to seal the above-mentioned grooves 2*e*1 and 2*e*2.

Then, the ends of all the silica glass pipes 5*a*, 5*b*, 6*a*, and 6*b* having accommodated therein the connection wires 3*a*, 3*b*, 4*a*, and 4*b* are sealed, and the pipes are accommodated in the silica glass pipe 7 having the large diameter. It should be noted that this sealing structure can be sealed by using a conventionally known pinch seal structure.

Further, the arrangement pattern of the carbon wire heating element CW will be described in particular.

The carbon wire heating element CWA arranged in the area A is connected with the connection wire 4*a* in the position a in the center of the heating surface 1*a*, arranged in the arrangement pattern form as shown in FIG. 1, and connected with the connection wire 4*b* in the position b in the center of the heating surface 1*a*.

On the other hand, the carbon wire heating element CWB arranged in the area B is connected with the connection wire 4*a* in the position a in the center of the heating surface 1*a*, arranged in the arrangement pattern form as shown in FIG. 1, and connected with the connection wire 4*b* in the position b in the center of the heating surface 1*a*.

The carbon wire heating element CWA arranged in the area A and the carbon wire heating element CWB arranged in the area B are thus connected with the connection wire 4*a* and the connection wire 4*b*, and therefore electrically connected in parallel, as shown in FIG. 8 (*a*).

Further, the carbon wire heating element CWC arranged in the area C is connected with the connection wire 3*a* in the position d of the periphery side portion of the heating surface 1*a*, arranged in the arrangement pattern form as shown in FIG. 1, and connected with the connection wire 3*b* in the position f of the periphery portion of the heating surface 1*a*.

On the other hand, the carbon wire heating element CWD arranged in the area D is connected with the connection wire 3*a* in the position d of the periphery side portion of the heating surface 1*a*, arranged in the arrangement pattern form as shown in FIG. 1, and connected with the connection wire 3*b* in the position f in the center of the heating surface 1*a*.

Thus, the carbon wire heating element CWC arranged in the area C and the carbon wire heating element CWD arranged in the area D are connected with the connection wire 3*a* and the connection wire 3*b*, and connected in parallel, as shown in FIG. 8 (*b*).

The connection wires 3*a*, 3*b*, 4*a*, and 4*b* are thus arranged, so that the inner area can be formed into two areas and the outer area can be formed into two areas, which are each connected electrically in parallel, whereby electricity can be equally supplied to each area.

Further, as described above, the above-mentioned connection wire 3*b* passing along the groove 2*e*1 which extends in the diameter direction and is formed at the bottom of the second silica glass member 2b, is provided from the position d in the center of the heating surface 1a to the position f, and connected with the carbon wire heating elements CWC and CWD.

Similarly, the above-mentioned connection wire 3a passing along the groove 2e2 which extends in the diameter direction and is formed at the bottom of the second silica glass member 2b, is provided from the position c in the center of the heating surface 1a to the position e, and connected with the carbon wire heating elements CWC and CWD.

These connection wires 3a and 3b are extended from the center of the heating surface 1a toward the outer area, without intersecting the carbon wire heating elements CWA and CWB in the areas A and B.

In other words, in the second silica glass member 2b, the grooves 2e1 and 2e2 are formed at the bottom of an area (boundary area between area A and area B) in which the groove 2d is not formed.

In the case where the above-mentioned connection wires 3a and 3b intersect the carbon wire heating elements CWA and CWB in the areas A and B, heat accumulation arises, and the glass is devitrified (crystallized), and there is a possibility that it may be damaged by devitrification. Further, even in the case where it is not damaged, there is a possibility that the in-plane temperature of the heating surface 1a may become uneven.

Therefore, since the grooves 2e1 and 2e2 are formed in the area (boundary area between area A and area B) in which the groove 2d is not formed, the heat accumulation is inhibited, the in-plane temperature of the heating surface can be made uniform, and it is possible to prevent the devitrification and the damage.

Further, the arrangement pattern of the carbon wire heating elements CWA and CWB in the area A and the area B of the inner area is formed in a symmetric shape with respect to a point as shown in FIG. 1. Similarly, the arrangement pattern of the carbon wire heating elements CWC and CWD in the area C and the area D in the outer area is also formed in a symmetric shape with respect to a point. Thus, by causing them to be symmetric with respect to points, resistances of the carbon wire heating elements CWA and CWB and the carbon wire heating elements CWC and CWD are mutually equivalent. Even if they are connected together in parallel, heat unevenness may be avoided.

In addition, in the diameter direction of the heating surface 1a in the area A and the area B of the inner area, the carbon wire heating elements CWA and CWB are arranged at intervals of dimension t at substantially regular intervals. Further, in the diameter direction of the heating surface 1a in the area C and the area D of the outer area, the carbon wire heating elements CWC and CWD are arranged at substantially regular intervals at intervals of dimension s (i.e., dense) smaller than a space between the above-mentioned carbon wire heating elements CWA and CWB. In addition, as for "substantially regular intervals", each of the above-mentioned sizes t and s is preferably ±30%. When not arranging the heat equalizing plate at the top of the silica glass plate-like member in particular, ±10% is preferable and ±5% is more preferable.

Figure 13:
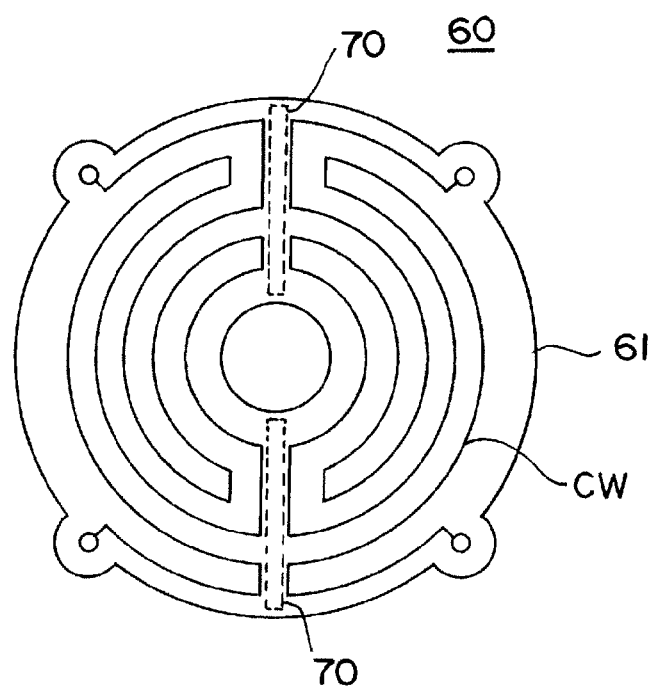
FIG. 13 is a plan view showing another conventional plane heater.
Figure 14:
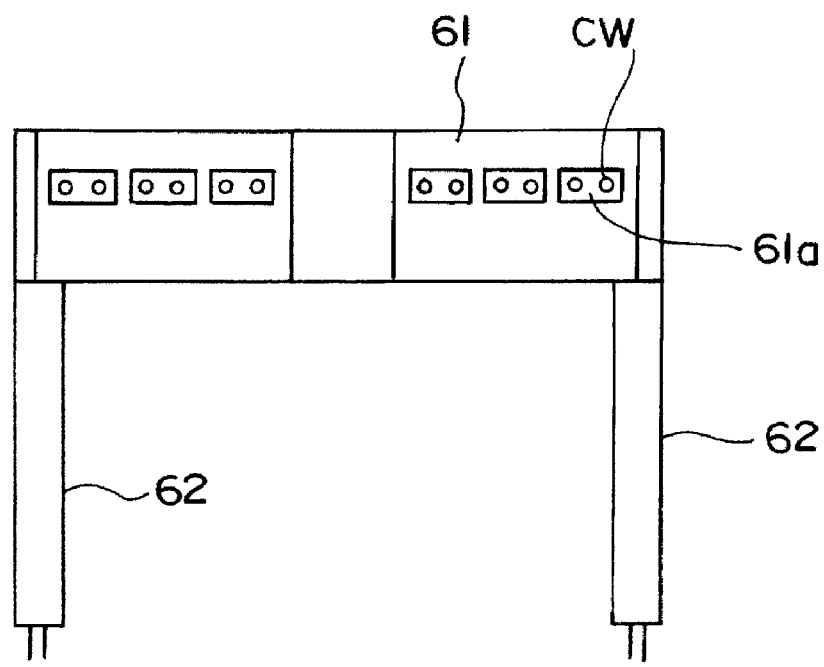
FIG. 14 is a side view showing another conventional plane heater.

Further, except for an area where the connection wires 3a and 3b connected to the carbon wire heating elements CWC and CWD in the outer area are arranged, the above-mentioned arrangement pattern does not have an area in which the carbon wire heating elements CWA and CWB do not exist and which is a linear and continuous area toward the periphery side from the center (for example, dotted line portion 70 in FIG. 13 showing the conventional plane heater).

Thus, there is not the linear and continuous area where the carbon wire heating elements CWA and CWB does not exist toward the periphery side from the center, so that the in-plane temperature of the heating surface 1a can be made uniform, and the inside of the plane of the heated material 1a can be heated uniformly.

Further, as shown in FIG. 7, a boundary L between the inner areas A and B and the outer areas C and D of the arrangement pattern exists at a distance of between 79% and 86% of a radius R from the circle center in the plane of the heating surface 1a. In the case where the boundary L between these inner areas A and B and the outer areas C and D is at a distance less than 79% of the radius R from the center of a circle in the plane, the outer areas C and D are large, it is not possible to avoid the high temperature in the center as in the conventional technology, and the surface uniformity of the heating surface 1a is inhibited. On the other hand, in the case where the boundary L between the inner areas A and B and the outer areas C and D is at a distance greater than 86% of the radius R from the center of the circle in the plane, the outer areas C and D are small, the heat generation rate in the outer areas C and D is insufficient, and the surface uniformity of the heating surface 1a is inhibited.

Further, as shown in FIG. 6, as examples of the above-mentioned carbon wire heating element CW, there may be mentioned a braid with a diameter of around 2 mm or one that is knitted in an interlace form by means of approximately 300 to 350 carbon fibers having a diameter of 5-15 μm (for example, carbon fibers with a diameter of 7 μm) which are bundled into approximately nine fiber bundles.

In the above-mentioned case, a knitting span of the wires is in the order of 2 to 5 mm, and carbon fiber fluff at the surface is in the order of 0.5 to 2.5 mm. It should be noted that the above-mentioned fluff is a part of cut carbon fiber projecting from the periphery side of the carbon wire as indicated by reference sign CWa in FIG. 6.

Further, a large number of bundled carbon wires with the same structure as the above-mentioned carbon wire heating element CW are used for the above-mentioned connection wires 3a, 3b, 4a, and 4b.

Thus, in the case where the connection wires 3a, 3b, 4a, and 4b are constituted by ones that are obtained by binding a large number of carbon wires with the same structure as the above-mentioned carbon wire heating element CW, a low resistance area can be formed more simply, while maintaining good electric connection.

Figure 9:
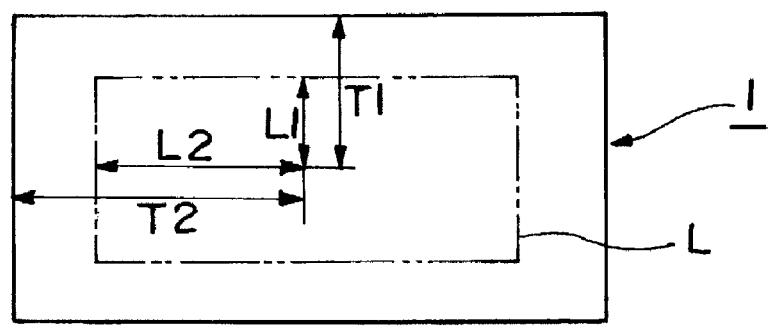
FIG. 9 is a view showing a modification of the plane heater in accordance with a preferred embodiment of the present invention.

It should be noted that, in the above-mentioned preferred embodiment, the case where the above-mentioned silica glass plate-like member is disk-shaped is described. However, as shown in FIG. 9, the silica glass plate-like member may be rectangular.

When the silica glass plate-like member is rectangular, it is desirable that the boundaries L (L1, L2) between the inner area and the outer area of the arrangement pattern exist at distances of between 79% and 86% of ½ lengths T1 and T2 of sides from the rectangle center in the plane. In the case where the boundaries L (L1, L2) between the inner area and the outer area of the arrangement pattern are at a distance less than 79% of the radius from the rectangle center in the plane, the outer area is large and it is not possible to avoid high temperature in the center as in the conventional technology. As a result, the surface uniformity of the heating surface is inhibited. On the other hand, in the case where the boundaries L (L1, L2) between the inner area and the outer area of the arrangement pattern are at a distance greater than 86% of the radius from the rectangle center in the plane, the outer area is small, the heat generation rate in the outer area is insufficient, and the surface uniformity of the heating surface is inhibited.

Figure 10:
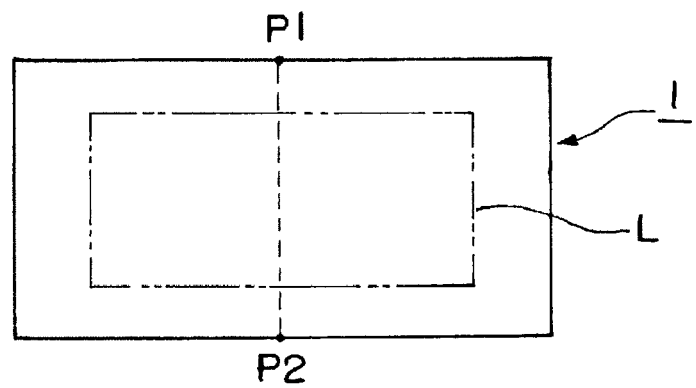
FIG. 10 is a view showing a modification of the plane heater in accordance with a preferred embodiment of the present invention.
Figure 11:
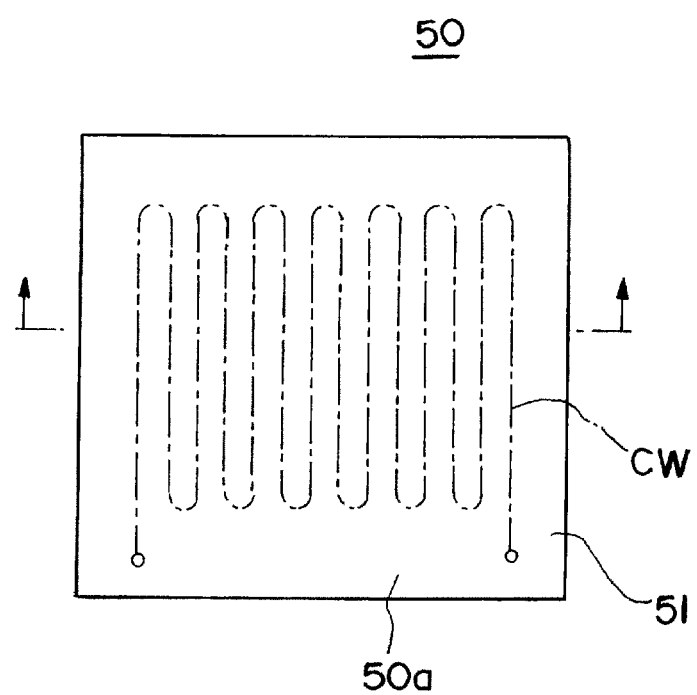
FIG. 11 is a plan view showing a conventional plane heater.
Figure 12:
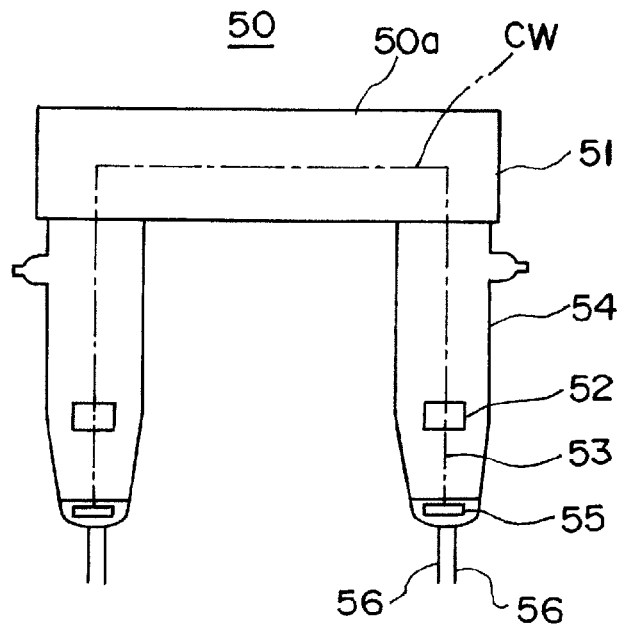
FIG. 12 is a side view showing the conventional plane heater.

Further, in the case where the above-mentioned silica glass plate-like member is rectangular, as shown in FIG. 10, it is preferable that the connection wires 3a and 3b which are extended from the center toward the outer area and are connected with the carbon wire heating elements in the outer area exist on the line linking respective central points P1 and P2 of two opposing sides.

Further, in the plane heater in accordance with the present invention, since the in-plane temperature of the heating surface can be made uniformly, it is not necessary to use the heat equalizing plate. In the plane heater in accordance with the present invention, however, in the case where the heat equalizing plate is arranged at the top of the silica glass plate-like member, the inside of the plane of the heated material can be heated more uniformly.

INDUSTRIAL APPLICABILITY

According to the plane heater in accordance with the present invention, it is possible to maintain the in-plane temperature of the heating surface to be uniform, so that the in-plane temperature of a material to be processed can be made uniform, and it is used suitably for heat treatments, such as a wafer, especially in a semiconductor manufacture process.

The invention claimed is:

1. A plane heater in which a carbon wire heating element is arranged and sealed two-dimensionally inside a silica glass plate-like member, characterized in that
surface arrangement densities of said carbon wire heating element are different in an inner area and an outer area located in the periphery, the surface arrangement density in said outer area is denser than the surface arrangement density in the inner area,
a power supply terminal unit having connection wires for supplying electricity to said carbon wire heating element is arranged in the center on the back side of said silica glass plate-like member,
the connection wire connected with the carbon wire heating element in said inner area is connected with the carbon wire heating element in the inner area in the center of said silica glass plate-like member,
the area where the connection wire connected with the carbon wire heating element in the outer area is arranged is a linear, continuous, and absent area where the carbon wire heating element passing from the center toward the periphery side does not exist, and
in the arrangement pattern of said carbon wire heating element, the linear, continuous, and absent area of the carbon wire heating element passing from the center toward the periphery side does not exist except for the area where the connection wire connected with the carbon wire heating element in the outer area is arranged, and
the connection wire connected with the carbon wire heating element in said outer area is extended from the center of said silica glass plate-like member toward the outer area, and is connected with the carbon wire heating element in the outer area, without intersecting the carbon wire heating element of said inner area.

2. The plane heater as claimed in claim 1, characterized in that said carbon wire heating element and said connection wire are carbon wires which are made by knitting a plurality of fiber bundles made by bundling carbon fibers and are in the shape of a braid or in the shape of an interlace.

3. The plane heater as claimed in claim 1, characterized in that said silica glass plate-like member is disc-shaped, and a boundary between said inner area and outer area exists at a distance of between 79%-86% of a radius from a circle center in the plane.

4. The plane heater as claimed in claim 1, characterized in that said silica glass plate-like member is rectangular and a boundary between said inner area and said outer area exists at a distance of between 79%-86% of ½ length of one side from a rectangle center in the plane.

5. The plane heater as claimed in claim 1, characterized in that said silica glass plate-like member is disc-shaped,
the connection wire which is extended from said center toward the outer area and connected with the carbon wire heating element in the outer area exists in a diameter position of the disc-shaped silica glass plate-like member, and
bordering said connection wire, said carbon wire heating elements are connected together electrically in parallel on both the inner area side and the outer area.

6. The plane heater as claimed in claim 1, characterized in that said silica glass plate-like member is rectangular,
the connection wire which is extended from the center toward the outer area and connected with the carbon wire heating element in the outer area exists on a line linking respective central points of two opposing sides, and
bordering said connection wire, said carbon wire heating elements are connected together electrically in parallel on both the inner area side and the outer area.

* * * * *